United States Patent
Fujii

(10) Patent No.: US 9,000,565 B2
(45) Date of Patent: Apr. 7, 2015

(54) SEMICONDUCTOR DEVICE

(71) Applicant: Renesas Electronics Corporation, Kawasaki-shi (JP)

(72) Inventor: Hiroki Fujii, Kawasaki (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/902,633

(22) Filed: May 24, 2013

(65) Prior Publication Data

US 2013/0249005 A1    Sep. 26, 2013

Related U.S. Application Data

(63) Continuation of application No. 13/317,168, filed on Oct. 12, 2011, now Pat. No. 8,482,102.

(30) Foreign Application Priority Data

Nov. 2, 2010 (JP) ................................. 2010-245828

(51) Int. Cl.
*H01L 29/66* (2006.01)
*H01L 27/06* (2006.01)
(Continued)

(52) U.S. Cl.
CPC ........ *H01L 27/0623* (2013.01); *H01L 29/0692* (2013.01); *H01L 29/8611* (2013.01); *H01L 29/87* (2013.01)

(58) Field of Classification Search
None
See application file for complete search history.

(56) References Cited

U.S. PATENT DOCUMENTS 4,972,247 A * 11/1990 Patterson et al. ............. 257/546
6,538,266 B2    3/2003 Lee et al.
(Continued)

FOREIGN PATENT DOCUMENTS

| JP | 2002-118178 A | 4/2002 |
|----|---------------|--------|
| JP | 2003-179150 A | 6/2003 |

(Continued)

OTHER PUBLICATIONS

Nils Jensen, et al. "Coupled Bipolar Transistors as Very Robust EDS Protection Devices for Automotive Applications" (2003 EOS/ESD Symposium) ESD Association.
(Continued)

*Primary Examiner* — Bilkis Jahan
*Assistant Examiner* — Kevin Quinto
(74) *Attorney, Agent, or Firm* — McGinn IP Law Group, PLLC

(57) ABSTRACT

A semiconductor device including a protection device and a protected device, the protection device includes a first semiconductor region of a second conductivity type formed over a substrate, a second semiconductor region of the second conductivity type provided in the first semiconductor region, having a higher impurity concentration than the first semiconductor region, a third semiconductor region of the second conductivity type formed in a surface layer of the second semiconductor region, having a higher impurity concentration than the second semiconductor region, a fourth semiconductor region of the second conductivity type formed in the first semiconductor region and located away from the third semiconductor region, having a higher impurity concentration than the first semiconductor region, a fifth semiconductor region of a first conductivity type formed in the first semiconductor region and electrically short-circuited with the fourth semiconductor region, and a sixth semiconductor region of the first conductivity type.

20 Claims, 13 Drawing Sheets

(51) Int. Cl.
*H01L 29/06* (2006.01)
*H01L 29/861* (2006.01)
*H01L 29/87* (2006.01)

(56) References Cited

U.S. PATENT DOCUMENTS

| | | |
|---|---|---|
| 6,770,918 B2 | 8/2004 | Russ et al. |
| 7,667,295 B2 | 2/2010 | Fujii |
| 2011/0186908 A1 | 8/2011 | Fujii |

FOREIGN PATENT DOCUMENTS

| | | |
|---|---|---|
| JP | 2008-172201 A | 7/2008 |
| JP | 2009-004763 A | 1/2009 |

OTHER PUBLICATIONS

Japanese Office Action dated Apr. 22, 2014 with an English translation.

\* cited by examiner

LOWER DOPED LAYER NOT EXISTENT

LOWER DOPED LAYER: PROFILE (1)

LOWER DOPED LAYER: PROFILE (2)

LOWER DOPED LAYER NOT EXISTENT

LOWER DOPED LAYER: PROFILE (1)

LOWER DOPED LAYER: PROFILE (2)

LOWER DOPED LAYER NOT EXISTENT

LOWER DOPED LAYER: PROFILE (1)

LOWER DOPED LAYER: PROFILE (2)

SEMICONDUCTOR DEVICE

The present application is a Continuation Application of U.S. patent application Ser. No. 13/317,168, filed on Oct. 12, 2011, which is based on and claims priority from Japanese patent application No. 2010-245828, filed on Nov. 2, 2010, the entire contents of which is incorporated herein by reference.

BACKGROUND

The present invention relates to semiconductor devices having a protection device for protecting the internal circuit against electrostatic discharge and other abnormal voltage.

A semiconductor device is provided with a protection device to protect its internal circuit against electrostatic discharge and other abnormal voltage. An example of the protection device is described in "Coupled Bipolar Transistors as Very Robust ESD Protection Devices for Automotive Applications" (2003 EOS/ESD Symposium). This device uses a thyristor which includes a vertical bipolar transistor and a horizontal bipolar transistor.

For the protection device, an important parameter is trigger voltage. The trigger voltage must be higher than the supply voltage and at the same time it must be lower than the withstand voltage of the device to be protected, or protected device. Therefore, it is desirable that the trigger voltage of the protection device can be freely decreased depending on the withstand voltage of the protected device.

For example, Japanese Patent Publication No. 2008-172201 describes a technique that a protection device uses a thyristor including a vertical bipolar transistor and a horizontal bipolar transistor and the base of the horizontal bipolar transistor has a double layer structure comprised of a lower doped layer and a highly-doped layer. According to this technique, the trigger voltage can be controlled by adjusting the distance between the two layers.

U.S. Pat. No. 7,667,295 describes that a protection device with a vertical bipolar transistor has a lower doped base region around the base region.

SUMMARY

For the protection device, hold voltage is also an important parameter in addition to trigger voltage. In the technique described in Japanese Patent Publication No. 2008-172201, as the trigger voltage is lower, the base width of the horizontal bipolar transistor is smaller, which increases the current amplification factor and decreases the hold voltage.

According to an aspect of the present invention, there is provided a semiconductor device which includes a protection device and a protected device, the protection device including a first semiconductor region of a second conductivity type formed over a substrate, a second semiconductor region of the second conductivity type provided in the first semiconductor region, having a higher impurity concentration than the first semiconductor region, a third semiconductor region of the second conductivity type formed in a surface layer of the second semiconductor region, having a higher impurity concentration than the second semiconductor region, a fourth semiconductor region of the second conductivity type formed in the first semiconductor region and located away from the third semiconductor region, having a higher impurity concentration than the first semiconductor region, a fifth semiconductor region of first conductivity type formed in the first semiconductor region and electrically short-circuited with the fourth semiconductor region, a sixth semiconductor region of the first conductivity type located so as to contain the fourth semiconductor region and the third semiconductor region, a seventh semiconductor region of the first conductivity type formed in the first semiconductor region, located between the second semiconductor region and the sixth semiconductor region away from the seventh semiconductor region, and electrically short-circuited with the fifth semiconductor region, and an eighth semiconductor region of the second conductivity type formed in the first semiconductor region and located between the sixth semiconductor region and the seventh semiconductor region away from the seventh semiconductor region, having a higher impurity concentration than the first semiconductor region.

According to another aspect of the present invention, a semiconductor device includes a protected device and a protection device each formed over a substrate, the protection device including a first semiconductor region of a second conductivity type formed over a substrate, a second semiconductor region of the second conductivity type provided in the first semiconductor region, having a higher impurity concentration than the first semiconductor region, a third semiconductor region of the second conductivity type formed in a surface layer of the second semiconductor region, having a higher impurity concentration than the second semiconductor region, a fourth semiconductor region of the second conductivity type formed in the first semiconductor region and located away from the third semiconductor region, having a higher impurity concentration than the first semiconductor region, a fifth semiconductor region of a first conductivity type formed in the first semiconductor region and electrically short-circuited with the fourth semiconductor region, a sixth semiconductor region of the first conductivity type located so as to contain the fourth semiconductor region and the third semiconductor region, and a seventh semiconductor region of the first conductivity type formed in the first semiconductor region, located between the second semiconductor region and the sixth semiconductor region away from the sixth semiconductor region.

According to the aspects of the present invention, only the trigger voltage can be controlled without change in the hold voltage.

BRIEF DESCRIPTION OF THE DRAWINGS

FIGS. 6A to 6C show two-dimensional profiles of impurity concentrations used for the simulation, in which FIG. 6A shows a case that there is no lower doped layer, FIG. 6B shows a case that the lower doped layer has the concentration profile expressed by (1) in FIG. 5, and FIG. 6C shows a case that the lower doped layer has the concentration profile expressed by (2) in FIG. 5;

FIGS. 7A to 7C show the frequencies of impact ionization in the cases shown in FIGS. 6A to 6C respectively, in which FIG. 7A shows a case that there is no lower doped layer, FIG. 7B shows a case that the lower doped layer has the concentration profile expressed by (1) in FIG. 5, and FIG. 7C shows a case that the lower doped layer has the concentration profile expressed by (2) in FIG. 5;

FIGS. 8A to 8C show current paths in the cases shown in FIGS. 6A to 6C respectively, in which FIG. 8A shows a case that there is no lower doped layer, FIG. 8B shows a case that the lower doped layer has the concentration profile expressed by (1) in FIG. 5, and FIG. 8C shows a case that the lower doped layer has the concentration profile expressed by (2) in FIG. 5;

DETAILED DESCRIPTION

Figure 1A:
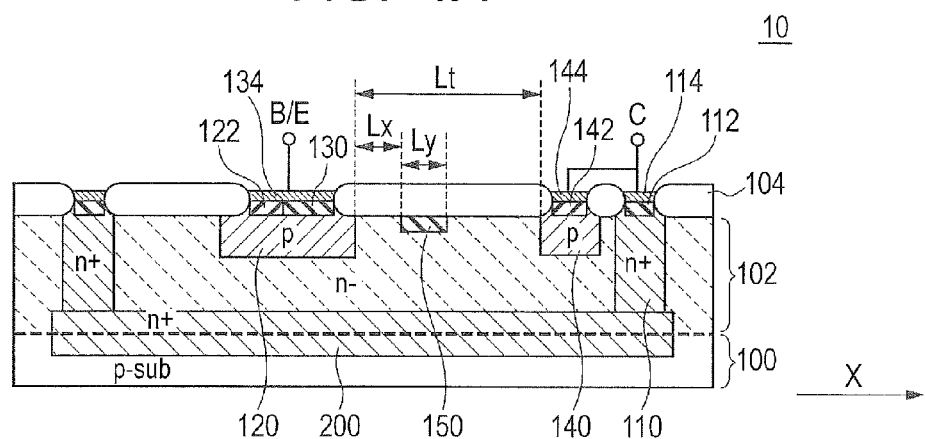
FIG. 1A is a sectional view showing the structure of a protection device according to a first embodiment of the present invention.

Next, the preferred embodiments of the present invention will be described referring to the accompanying drawings. In all the drawings, like elements with like functions are designated by like reference numerals and their repeated description is omitted.

First Embodiment

Figure 1B:
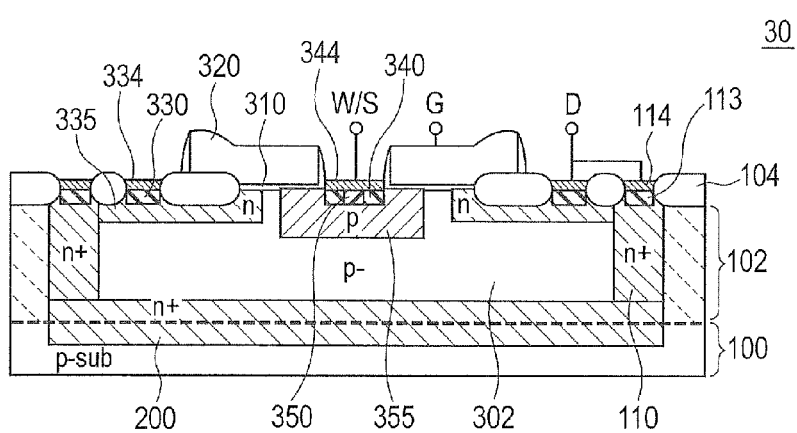
FIG. 1B is a sectional view showing the structure of a protected device according to the first embodiment.

FIGS. 1A and 1B are sectional views showing the structure of a semiconductor device according to the first embodiment. The semiconductor device according to the first embodiment has a protection device 10 as shown in FIG. 1A. The protection device 10, which is of the first conductivity type, includes a lower doped collector layer 102, sinker layer 110, highly-doped collector layer 112, emitter layer 130, highly-doped base layer 122, base layer 120, first-conductivity type layer 140, and second conductivity type layer 150. The lower doped collector layer 102 is formed over a substrate 100 and is of the second conductivity type (for example, n type). The sinker layer 110 is of the second conductivity type and provided in the lower doped collector layer 102 and has a higher impurity concentration than the lower doped collector layer 102. The highly-doped collector layer 112 is of the second conductivity type and formed on the surface layer of the sinker layer 110. The highly-doped collector layer 112 has a higher impurity concentration than the sinker layer 110. The emitter layer 130 is formed in the lower doped collector layer 102 and located away from the highly-doped collector layer 112. The emitter layer 130 has a higher impurity concentration than the lower doped collector layer 102. The highly-doped base layer 122 is formed in the lower doped collector layer 102 and electrically short-circuited with the emitter layer 130. The base layer 120 is of the first conductivity type and located so as to contain the emitter layer 130 and the highly-doped base layer 122. The base layer 120 has a lower impurity concentration than the highly-doped base layer 122. The first conductivity type layer 140 is formed in the lower doped collector layer 102 and located between the sinker layer 110 and base layer 120 and is not included in the base layer 120. Specifically, the first conductivity type layer 140 is located away from the gate electrode of the base layer 120. The first conductivity type layer 140 is electrically short-circuited with the highly-doped collector layer 112. The second conductivity layer 150 is formed in the lower doped collector layer 102 and located between the base layer 120 and first conductivity type layer 140. Specifically the second conductivity type layer 150 is located away from the first conductivity type layer 140. The second conductivity type layer 150 has a higher impurity concentration than the lower doped collector layer 102. A detailed description is given below.

The substrate 100 is, for example, a p-type silicon substrate. The lower doped collector layer 102 is an n-type epitaxial layer formed over the substrate 100. Therefore, the impurity concentration is almost uniform in the lower doped collector layer 102.

As shown in FIG. 1A, in the area where the protection device 10 is formed, a buried layer 200 of the second conductivity type is formed in the boundary between the substrate 100 and lower doped collector layer 102. In a plan view, the buried layer 200 is located so as to overlap the emitter layer 130, highly-doped collector layer 112, base layer 120, first conductivity type layer 140, and second conductivity type layer 150, abutting on the bottom of the sinker layer 110. The sinker layer 110 is so formed as to surround the emitter layer 130, highly-doped collector layer 112, base layer 120, first conductivity type layer 140, and second conductivity type layer 150 as will be described later and the buried layer 200 lies under the sinker layer 110 and the whole surface of the area surrounded by the sinker layer 110 in a plan view. The buried layer 200 has a higher impurity concentration than the lower doped collector layer 102.

A device isolation film 104 is formed on the surface layer of the lower doped collector layer 102. The device isolation film 104 is formed, for example, by the LOCOS oxidation method and has openings in a region overlapping the sinker layer 110, a region overlapping the first conductivity type layer 140, and a region overlapping the base layer 120. A silicide layer is formed inside each of the openings in the surface layer of the lower doped collector layer 102.

Specifically, the highly-doped base layer 122 and emitter layer 130 adjoin each other and lie in the same opening made in the device isolation film 104. The highly-doped base layer 122 and emitter layer 130 are electrically coupled with each other through a silicide layer 134. The highly-doped collector layer 112 and emitter layer 130 are isolated from the first conductivity type layer 140 and sinker layer 110 by the device isolation film 104.

Also, the first conductivity type layer 140 is isolated from the sinker layer 110 by the device isolation film 104 and electrically coupled to the sinker layer 110 through a wire in a wiring layer. A highly-doped first conductivity type layer 142 is formed on the surface layer of the first conductivity type layer 140 and a silicide layer 144 is formed on the surface of the highly-doped first conductivity type layer 142. A silicide layer 114 is formed on the surface layer of the highly-doped collector layer 112.

As mentioned above, the second conductivity type layer 150 is located between the base layer 120 and first conductivity type layer 140 and has a higher impurity concentration than the lower doped collector layer 102. In this embodiment, the second conductivity type layer 150 lies under the device isolation film 104. The second conductivity type layer 150 has a lower impurity concentration than the sinker layer 110. Specifically both the second conductivity type layer 150 and sinker layer 110 have impurity concentration distributions and the highest concentration part of the second conductivity type layer 150 has a higher impurity concentration than the highest concentration part of the sinker layer 110. The impurity concentration of the second conductivity type layer 150 is, for example, not more than 10% of that of the sinker layer 110. Also, desirably the impurity concentration and width Ly of the second conductivity type layer 150 should be determined so that it is completely depleted when the boundary between the base layer 120 and lower doped collector layer 102 breaks down. The peak impurity concentration of the second conductivity type layer 150 is, for example, not less than $5E16^{-1}$ cm$^{-3}$ and not more than $1E17$ cm$^{-3}$ and the width Ly of the second conductivity type layer 150 is, for example, not more than half of the distance between the base layer 120 and first conductivity type layer 140.

FIG. 1B is a sectional view showing the structure of the protected device 30. The protected device 30 is formed over the same substrate 100 as the protection device 10 and protected against electrostatic discharge and other abnormal voltage by the protection device 10. The protected device 30 shown in FIG. 1B is a high withstand voltage MOS transistor which has a gate insulating film 310, gate electrode 320, drain region 330, and source region 340. The drain region 330 is isolated from a channel region and a source region 340 by the device isolation film 104. A silicide layer 334 is formed on the surface layer of the drain region 330 and a silicide layer 344 is formed on the surface layer of the source region 340.

In the area where the protected device 30 is formed, a buried layer 200, sinker layer 110, and highly-doped layer 113 of the first conductivity type are formed. The highly-doped layer 113 has the same structure as the highly-doped collector layer 112 and has a silicide layer 114 on its surface. The buried layer 200 lies across the area where the protected device 30 is formed. The sinker layer 110 is so formed as to surround the protected device 30 in a plan view. The first conductivity type well 302 of the protected device 30 is isolated from the other regions of the lower doped collector layer 102 by the buried layer 200 and sinker layer 110. Also the voltage applied to the sinker layer 110, highly-doped collector layer 112, and buried layer 200 is the same as the voltage applied to the drain region 330.

An extension region 335 is formed around the drain region 330. The extension region 335 extends up to the vicinity of the channel region through the area under the device isolation film 104 between the drain region 330 and source region 340.

A highly-doped first conductivity type layer 350 and a first conductivity type layer 355 are formed in the vicinity of the source region 340. The highly-doped first conductivity type layer 350 is adjacent to the source region 340 and electrically coupled to the source region 340 through the silicide layer 344. The first conductivity type layer 355 has a larger depth than the source region 340 and highly-doped first conductivity type layer 350 and contains them.

Figure 2:
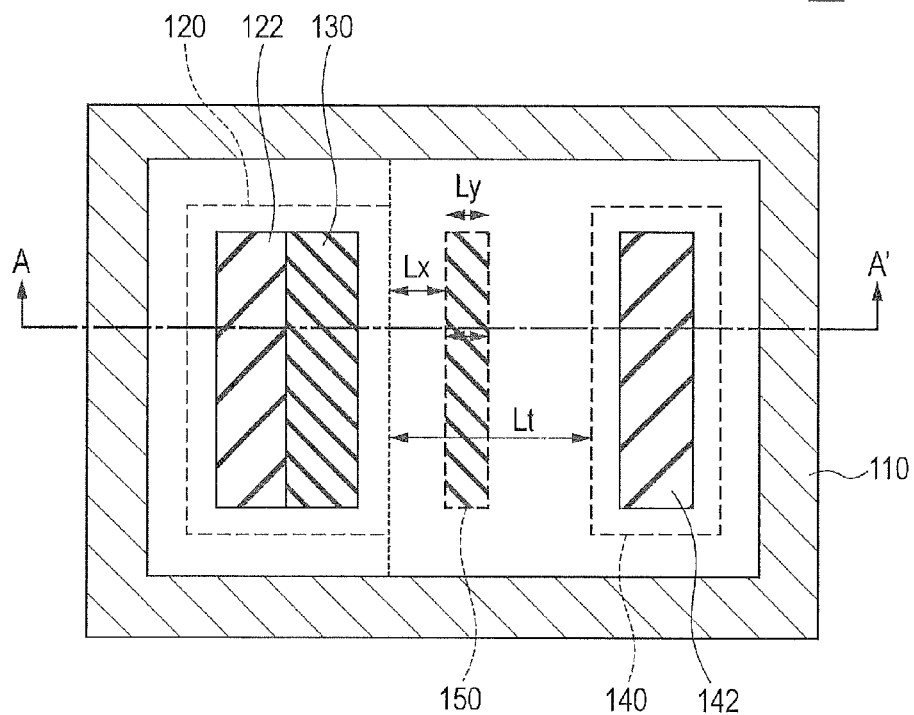
FIG. 2 is a plan view of the protection device shown in FIG. 1A.

FIG. 2 is a plan view of the protection device 10 shown in FIG. 1A. FIG. 1A is a sectional view taken along the line A-A of FIG. 2. For simple illustration, the silicide layers, etc. are omitted in FIG. 2.

In this embodiment, the sinker layer 110 and highly-doped collector layer 112 surround the base layer 120, highly-doped base layer 122, emitter layer 130, first conductivity type layer 140, highly-doped first conductivity type layer 142, and second conductivity type layer 150. The second conductivity type layer 150 is not coupled to the sinker layer 110. However, the second conductivity type layer 150 may be coupled to the sinker layer 110 when necessary.

Specifically, the planar shapes of the highly-doped base layer 122, emitter layer 130, second conductivity type layer 150, first conductivity type layer 140, and highly-doped first conductivity type layer 142 are almost rectangular with their long sides stretching in a first direction (vertical direction in FIG. 2). The long sides of the highly-doped base layer 122, emitter layer 130, and highly-doped first conductivity type layer 142 are almost equal in length and their ends are in alignment with each other when viewed in the first direction.

The planar shape of the second conductivity type layer 150 is also almost rectangular with its long sides stretching in the first direction. In other words, one long side of the emitter layer 130 and one long side of the first conductivity type layer 140 face each other and the second conductivity type layer 150, located between these two long sides, stretches in the same direction as the two long sides. In the example shown in FIG. 2, the second conductivity type layer 150 has the same long side length as the highly-doped base layer 122, etc. and their long side ends are in alignment with one another when viewed in the first direction. However, the planar shape of the second conductivity type layer 150 is not limited to the above-mentioned; instead it may have a larger long side length than the highly-doped base layer 122, etc.

Figure 3A:
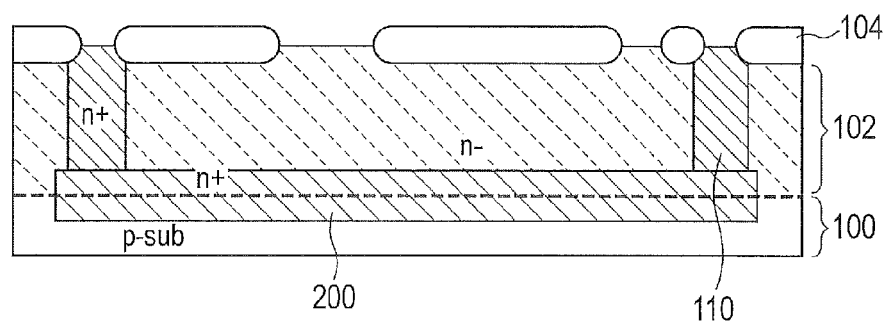
FIG. 3A is a sectional view illustrating a step for manufacturing the protection device and protected device which includes the formation of a lower doped collector layer.

Next, the method for manufacturing the protection device 10 and protected device 30 will be explained referring to FIGS. 3A and 3B and FIGS. 1A and 1B. First, as shown in FIG. 3A, a buried layer 200 is formed by implanting impurities of the second conductivity type into the substrate 100. Then, a lower doped collector layer 102, for example, with a thickness in the range from several micrometers to ten-odd micrometers is formed by forming an epitaxial layer of the second conductivity type over the substrate 100. Then, impurities of the first conductivity type are partially implanted and heat treatment of 1100° C. to 1200° C. is carried out to form a first conductivity type well 300 (not shown in FIG. 3A) for the protected device 30. In the heat treatment process, the buried layer 200 spreads into the lower doped collector layer 102.

Instead of the above process, the following process may be adopted: an epitaxial layer of the first conductivity type is formed over the substrate 100, then impurities of the second conductivity type are implanted selectively and heat treatment of 1100° C. to 1200° C. is carried out to form a lower doped collector layer 102. In this case, for the first conductivity type well 302, the first conductivity type epitaxial layer is used as it is.

Next, a device isolation film 104 is formed. After that, impurities of the second conductivity type are selectively implanted into the lower doped collector layer 102 to form a sinker layer 110. Heat treatment of 1100° C. to 1200° C. may be carried out when necessary.

Figure 3B:
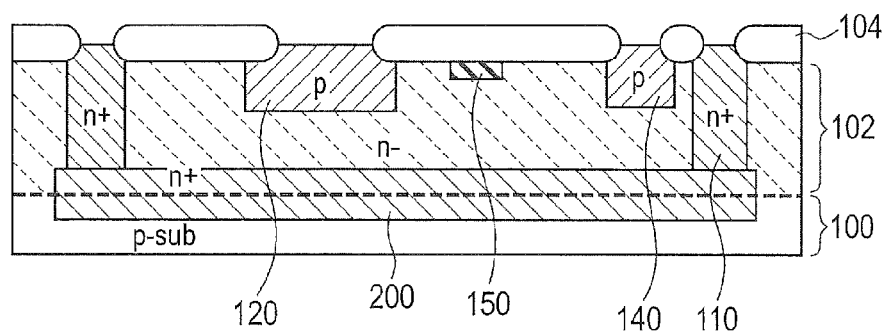
FIG. 3B is a sectional view illustrating a next step for manufacturing the protection device and protected device which includes the formation of a second conductivity type layer.

Next, as shown in FIG. 3B, impurities of the first conductivity type are selectively implanted into the lower doped collector layer 102 to form a base layer 120 and a first conductivity type layer 140. In this process, a first conductivity type layer 355 (not shown in FIG. 3B) is also formed for the protected device 30.

Then, impurities of the second conductivity type are selectively implanted into the lower doped collector layer 102 to form a second conductivity type layer 150. In this process, an extension region 335 is also formed for the protected device 30.

Then, as shown in FIGS. 1A and 1B, a highly-doped base layer 122, highly-doped first conductivity type layer 142, and highly-doped first conductivity type layer 350 are formed by selectively implanting impurities of the first conductivity type into the lower doped collector layer 102. Also, a highly-doped collector layer 112, emitter layer 130, drain region 330, and source region 340 are formed by selectivity implanting impurities of the second conductivity type into the lower doped collector layer 102. After that, silicide layers are formed.

Next, the effect of the first embodiment will be described. According to the first embodiment, the trigger voltage can be controlled by adjusting the distance Lx between the second conductivity type layer 150 and base layer 120 (see FIG. 1A and FIG. 2). Even if the distance Lx is changed, the hold voltage remains virtually unchanged. Therefore, only the trigger voltage can be controlled without change in the hold voltage by adjusting the distance Lx. This mechanism is described in detail below.

In this embodiment, a ground voltage is applied to the highly-doped base layer 122 and emitter layer 130. If an abnormal voltage is applied to highly-doped first conductivity type layer 142 and highly-doped collector layer 112, a breakdown first occurs in the interface between the base layer 120 and lower doped collector layer 102. As a consequence, the PN diode comprised of the base layer 120 and lower doped collector layer 102 turns on.

Then, an avalanche breakdown occurs in the base layer 120, which causes the PN diode comprised of the base layer 120 and emitter layer 130 to turn on. In this state, the vertical bipolar transistor comprised of the emitter layer 130, base layer, and lower doped collector layer 102 (for example, NPN bipolar transistor) turns on. The collector current flows through the buried layer 200.

After that, the horizontal bipolar transistor comprised of the base layer 120, lower doped collector layer 102, and first conductivity type layer 140 (for example, PNP bipolar transistor) turns on. As a consequence, the thyristor, which is constituted by the vertical bipolar transistor and horizontal bipolar transistor, functions.

On the other hand, in this embodiment, due to the existence of the second conductivity type layer 150, there is a concentration of isoelectric lines in the lower doped collector layer 102's portion lying between the second conductivity type layer 150 and base layer 120. This causes a rise in the highest electric field (namely the electric field where a breakdown occurs) among the electric fields of the PN junction interface between the base layer 120 and lower doped collector layer 102. Here, when the distance Lx is adjusted, the density of isoelectric lines also changes in the lower doped collector layer 102's portion lying between the second conductivity type layer 150 and base layer 120, causing the electric field of the PN junction interface between the base layer 120 and lower doped collector layer 102 to change. On the other hand, the electric field required for a breakdown does not change. Therefore, the trigger voltage can be changed by adjusting the distance Lx.

On the other hand, since the second conductivity type layer 150 has the same conductivity type as the lower doped collector layer 102, its characteristics are less affected when the thyristor, comprised of the vertical bipolar transistor and horizontal bipolar transistor, is in a steady state. Therefore, the hold voltage hardly changes. Particularly in this embodiment, the impurity concentration and width Ly of the second conductivity layer 150 are determined so that it is completely depleted when the boundary between the base layer 120 and lower doped collector layer 102 breaks down. Therefore, the hold voltage is hardly affected by the distance Lx.

Figure 4A:
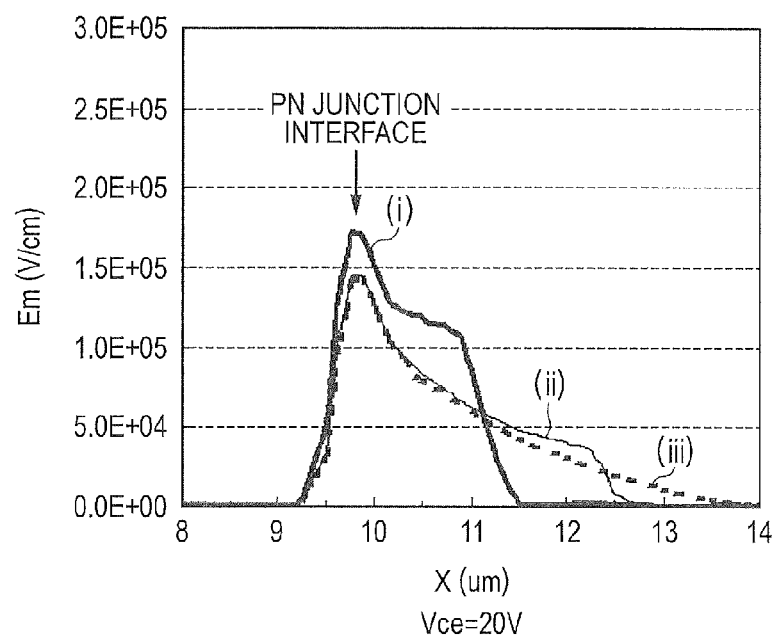
FIG. 4A is a graph showing change in the electric field strength in the X direction shown in FIG. 1A before avalanche breakdown when the voltage Vce between the emitter layer and base layer is 20 V (dependence of horizontal electric field strength (Em) on horizontal position (X))
Figure 4B:
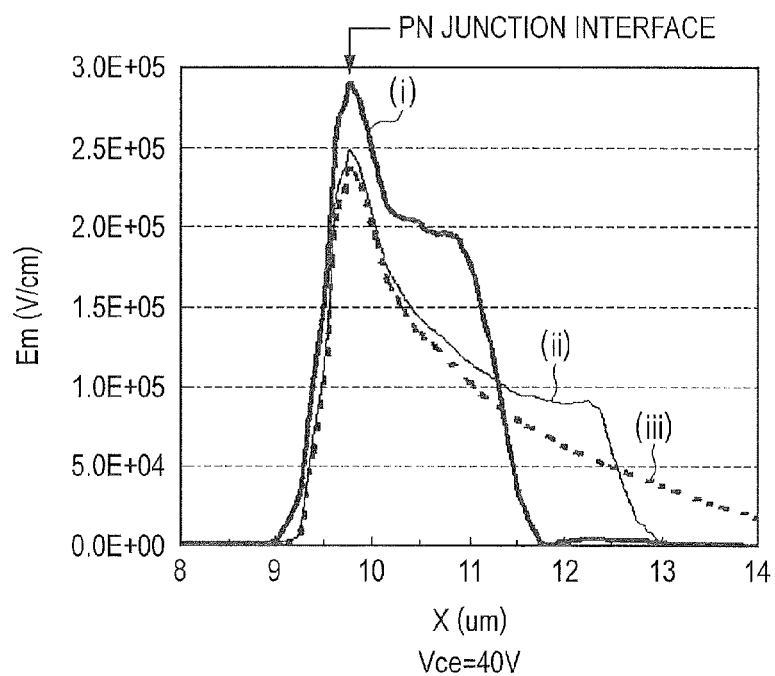
FIG. 4B is a graph showing change in the electric field strength in the X direction shown in FIG. 1A before avalanche breakdown when Vce is 40 V.

From the simulation result shown in FIGS. 4A and 4B it is apparent that the existence of the second conductivity type layer 150 produces a concentration of isoelectric lines in the lower doped collector layer 102's portion between the second conductivity type layer 150 and base layer 120. FIG. 4A shows change in the electric field strength in the X direction shown in FIG. 1A before an avalanche breakdown when the voltage Vce between the emitter layer 130 and base layer 120 is 20 V (dependence of horizontal electric field strength (Em) on horizontal position (X)). FIG. 4B shows change in the electric field strength in the X direction shown in FIG. 1A when the voltage Vce is 40 V. In both graphs, (i) represents a case that Lx is shorter than in the case of (ii) (concretely half of Lx in the case of (ii)) and (iii) represents a case that the second conductivity type layer 150 does not exist.

The above effect of the second conductivity type layer 150 can be confirmed by a device simulation.

Figure 5:
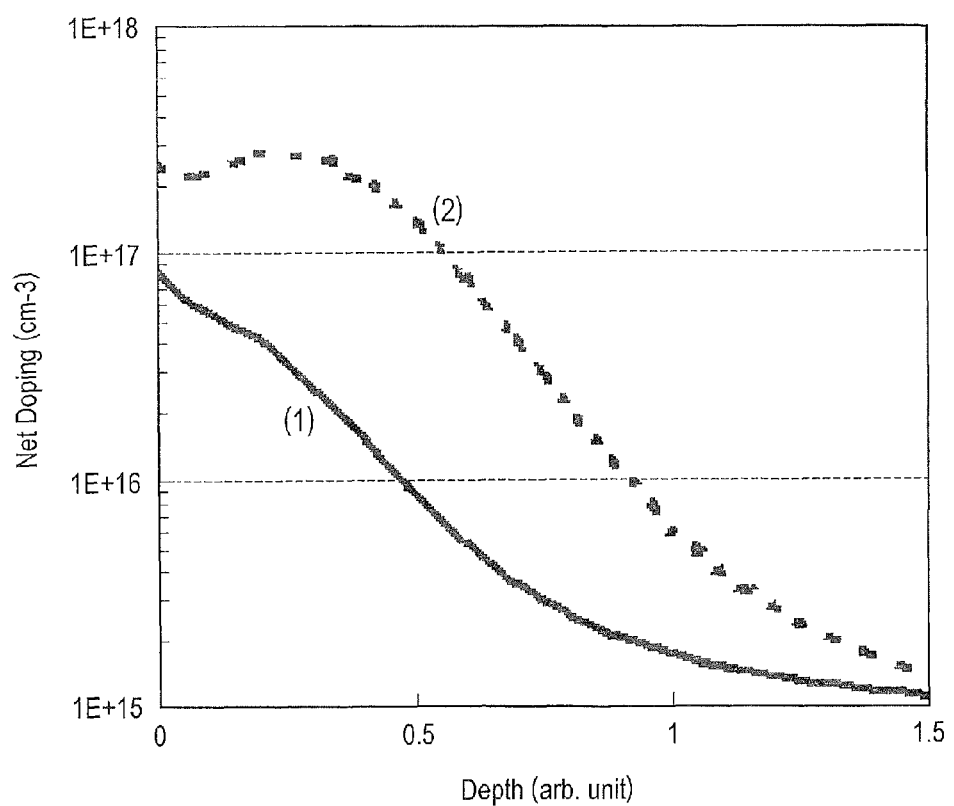
FIG. 5 is a graph showing the distribution of impurity concentrations in the depth direction of the second conductivity type layer used in a device simulation.

FIG. 5 shows the distribution of impurity concentrations in the depth direction of the second conductivity type layer 150 used in the device simulation. In FIG. 5, (1) represents a profile that the impurity concentration at the surface is 8E16 $cm^{-3}$ and that at a depth of 1.2 μm is 1E15 $cm^{-3}$. In FIG. 5, (2) represents a profile that the impurity concentration at the surface is 2.5E17 $cm^{-3}$ and that at a depth of 1.7 μm is 1E15 $cm^{-3}$.

The following two layout designs of impurity layers were prepared: in the first layout design, the distance Lt between the base layer 120 and first conductivity type layer 140 is 8 μm, the width Ly of the second conductivity type layer 150 is 1 μm, and the distance Lx between the base layer 120 and second conductivity type layer 150 is 1.5 μm, 3.4 μm, or 7 μm. In the second layout design, Lt is 8 Lx is 1.5 μm, and Ly is 1 μm, 3 μm, or 7 μm.

Figure 6A:
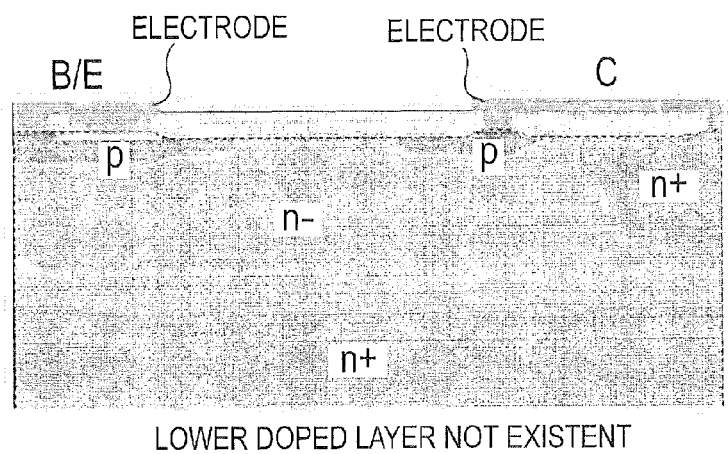
Figure 6B:
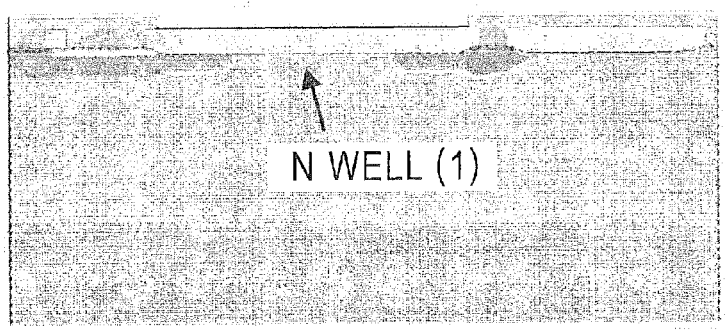
Figure 6C:
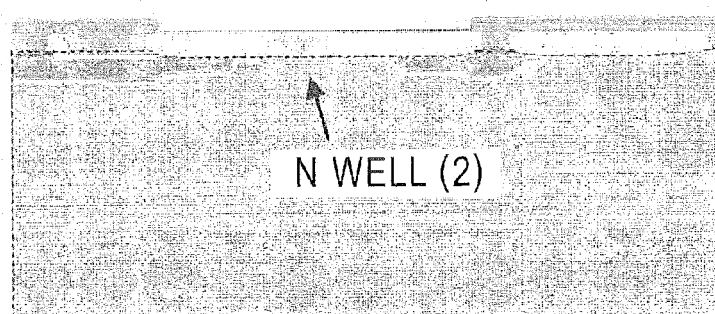
Figure 7A:
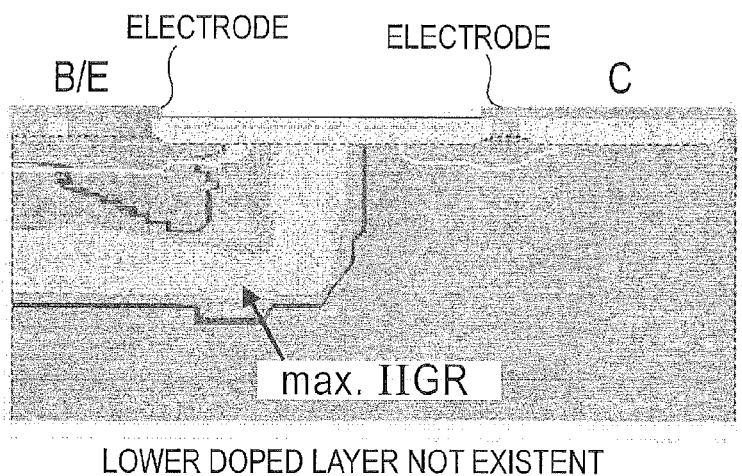
Figure 7B:
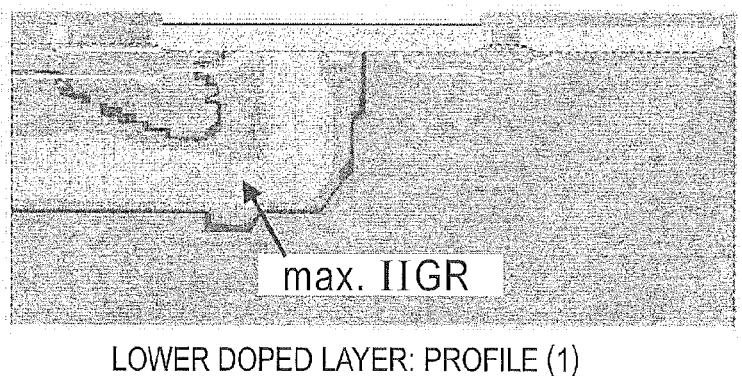
Figure 7C:
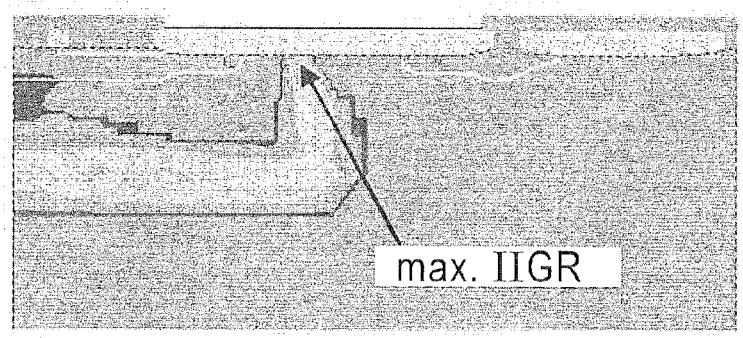
Figure 8A:
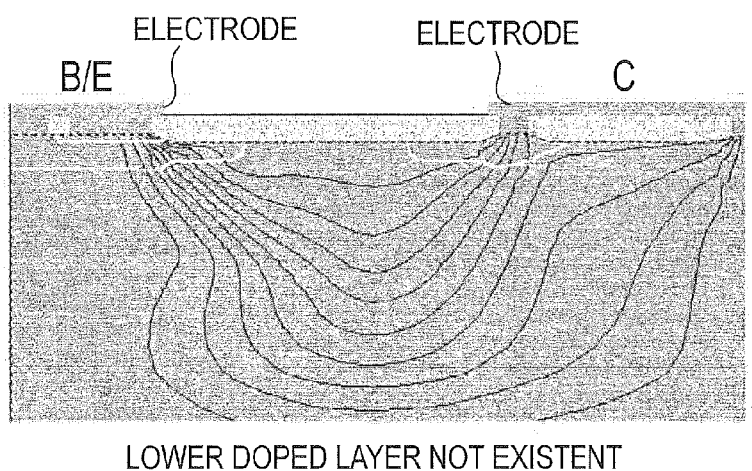
Figure 8B:
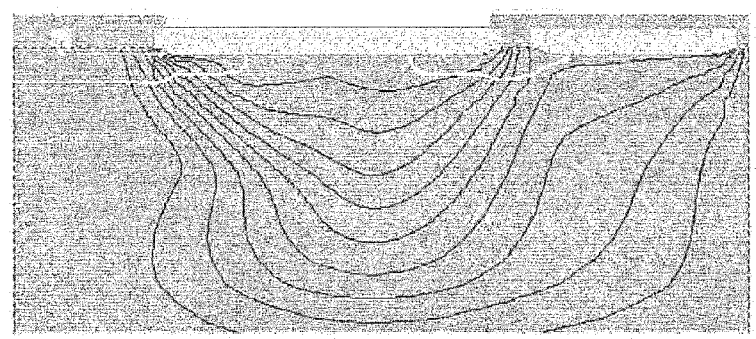
Figure 8C:
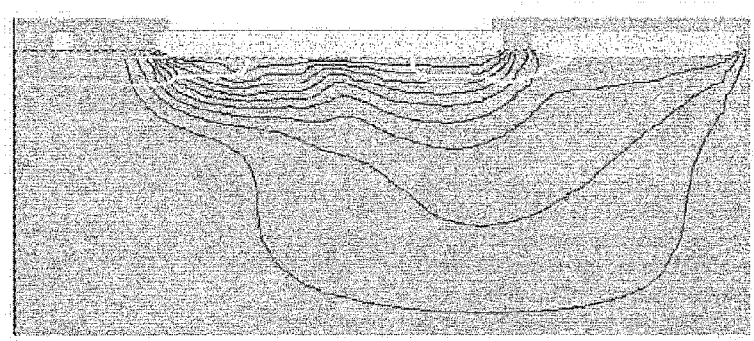

FIGS. 6A to 6C, 7A to 7C, and 8A to 8C show simulation results of the second layout design in which Ly is 1 μm. FIGS. 6A to 6C show two-dimensional profiles of impurity concentrations used in the simulation. FIGS. 7A to 7C show the frequencies of impact ionization in the cases shown in FIGS. 6A to 6C respectively and FIGS. 8A to 8C show current paths in the cases shown in FIGS. 6A to 6C respectively.

Figure 9:
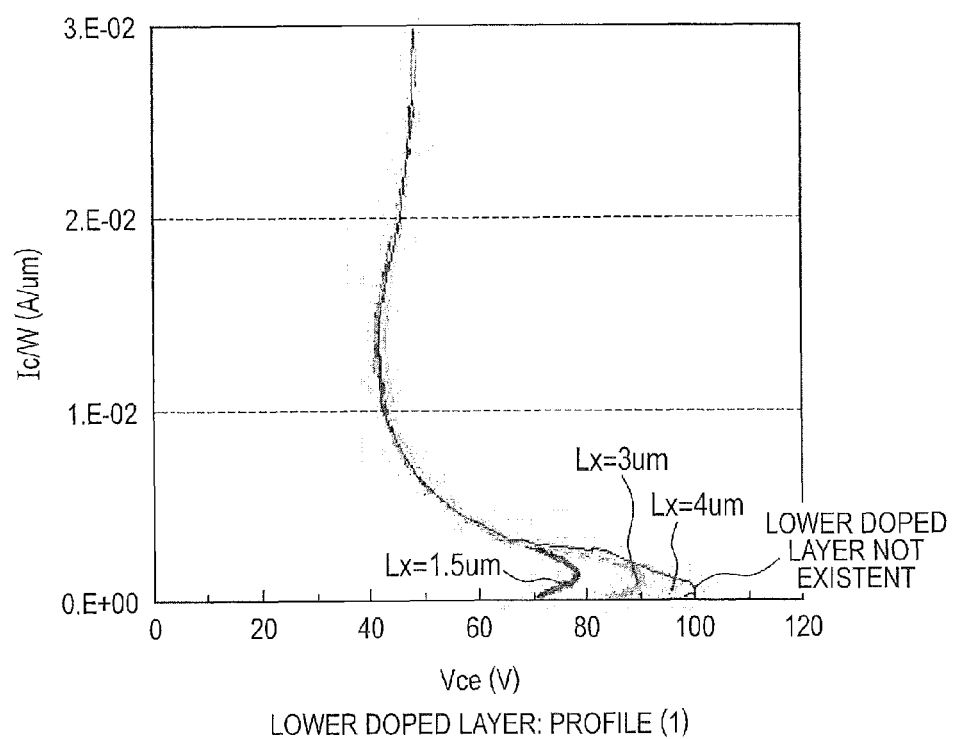
FIG. 9 is a graph showing the relation between Vce and collector current density in the case that the second conductivity type layer has the impurity concentration profile expressed by (1) in FIG. 5.
Figure 10:
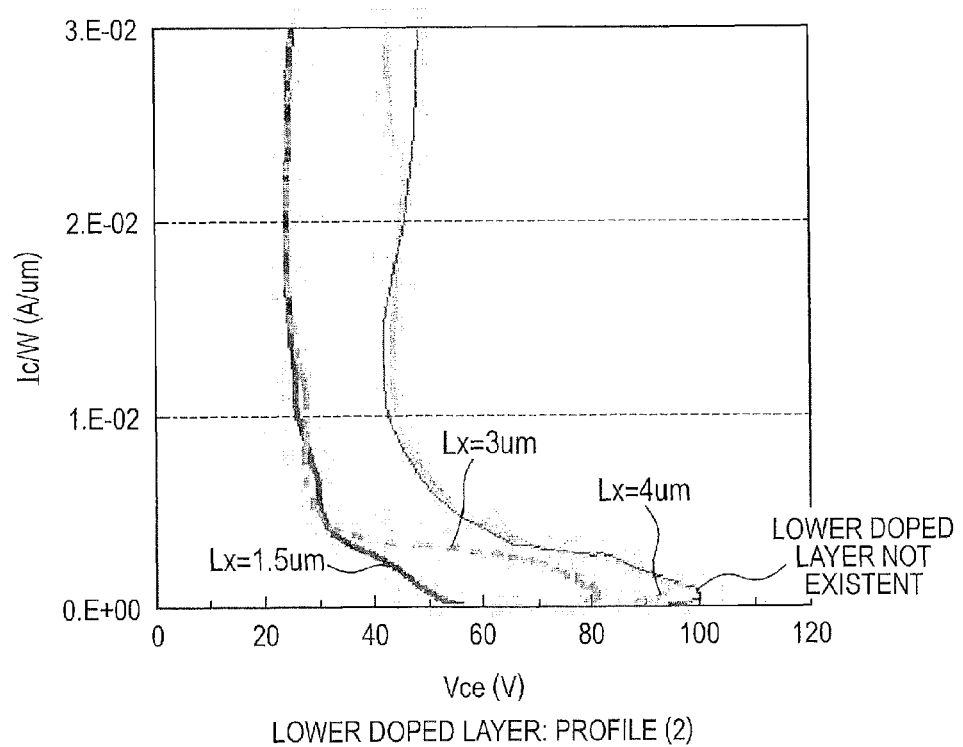
FIG. 10 is a graph showing the relation between Vce and collector current density in the case that the second conductivity type layer has the impurity concentration profile expressed by (2) in FIG. 5.

FIG. 9 shows the relation between Vce and collector current density in the case that the second conductivity type layer 150 has the impurity concentration profile expressed by (1) in FIG. 5. FIG. 10 shows the relation between Vce and collector current density in the case that the second conductivity type layer 150 has the impurity concentration profile expressed by (2) in FIG. 5.

First, the effect of change in Lx is discussed. From FIGS. 9 and 10 it is known that the trigger voltage can be controlled for both concentration profiles by changing the value of Lx in the range from 1.5 μm to 4 μm.

However, as shown in FIG. 10, in the profile expressed by (2) in FIG. 5, namely the higher impurity concentration profile, the hold voltage considerably decreases from a little more than 40 V, a value before the introduction of the second conductivity type layer 150, to a little less than 20 V. This may be because even after a sufficient Kirk effect occurs after snapback, a portion of the second conductivity type layer 150 does not become a base region but remains as a collector region and its vicinity is the largest impact ion source (FIG. 7C). In other words, in the boundary between the second conductivity type layer 150 and lower doped collector layer 102, the concentration profile steeply changes and electric fields easily concentrate, so a base current which supplies a constant collector current (namely, avalanche current) is produced and thus the collector voltage (namely, hold voltage) is relatively low. As a result, the current paths come closer to the substrate surface (FIG. 8C) and breakdown due to self-heating easily occurs, which may cause a decline in the tolerance of the protection device.

On the other hand, as shown in FIG. 9, in the profile expressed by (1) in FIG. 5, namely the lower impurity concentration profile ((1) in FIG. 5), the hold voltage is held at a little more than 40 V, a value before the introduction of the second conductivity type layer 150, whether Lx is 1.5 μm, 3 μm, or 4 μm. This is because due to a Kirk effect after snapback, the whole second conductivity type layer 150 becomes a base region and the largest impact ion source is held in the boundary between the buried layer 200 and lower doped collector layer 102 (FIG. 7B) as before the introduction of the second conductivity type layer 150 (FIG. 7A). In other words, in this boundary, the profile is relatively gentle, so electric fields hardly concentrate, which means that a higher collector voltage (namely, hold voltage) is required to keep the collector current constant. As a result, the current paths run deep in the lower doped collector layer 102 (FIG. 8B) as before the introduction of the second conductivity type layer 150 (FIG. 8A), so the tolerance of the protection device is maintained.

Figure 11:
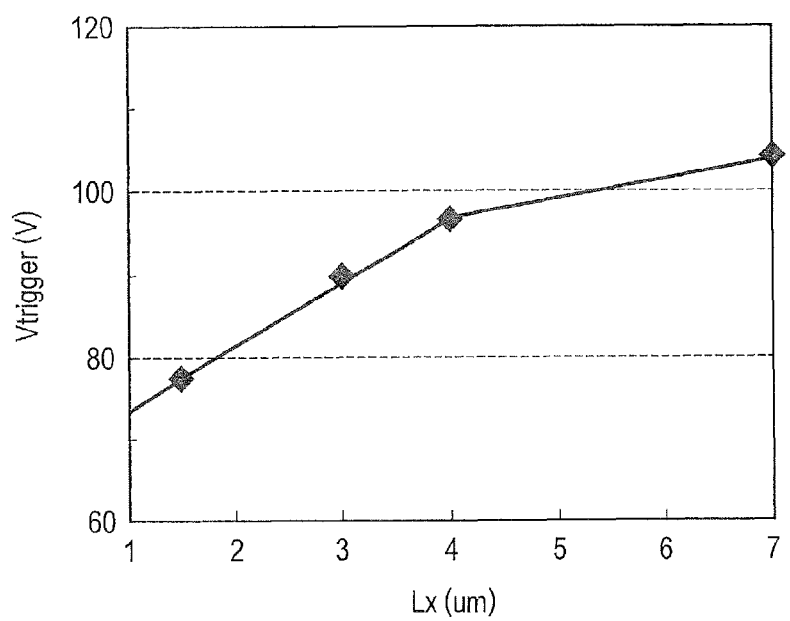
FIG. 11 is a graph showing the relation between Lx and trigger voltage with the profile (2) in FIG. 5.

FIG. 11 shows the relation between Lx and trigger voltage with the profile (2) shown in FIG. 5. If Lx is more than 4 μm, the second conductivity type layer 150 is remoter from the base layer, which means that it is hard to control the trigger voltage as far as Lx is more than 4 μm. Also, if the distance between the emitter (first conductivity type layer 140) of the horizontal bipolar transistor and the second conductivity type layer 150 (Lt−(Lx+Ly)) is too short, there is a risk that if a negative surge voltage momentarily gets in the highly-doped collector layer 112 and first conductivity type layer 140, a breakdown may easily occur there because of the potential difference between the second conductivity type layer 150 and first conductivity type layer 140. Therefore, it is at least necessary to keep the second conductivity type layer 150 away from the first conductivity type layer 140.

Figure 12:
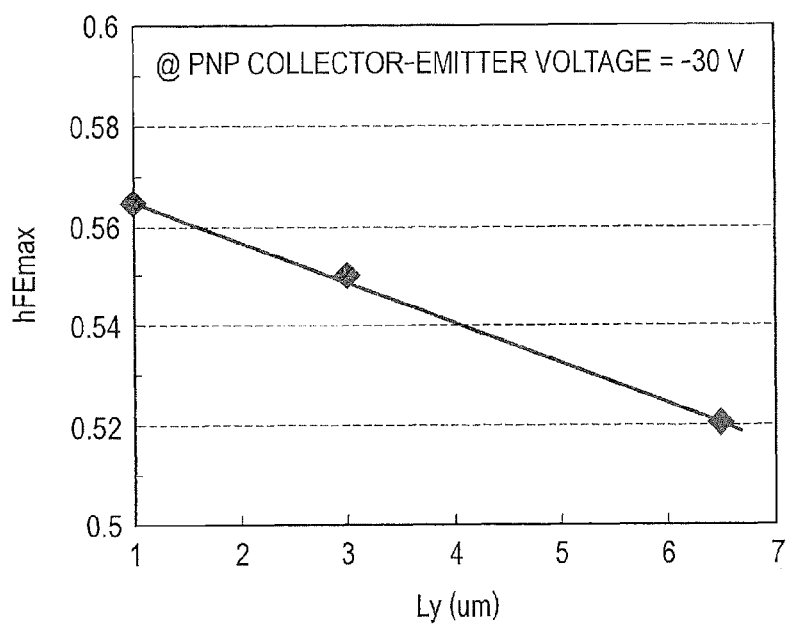
FIG. 12 is a graph showing the dependence of the maximum hFE (current amplification factor) of the horizontal bipolar transistor on Ly which was found by a device simulation.

FIG. 12 is a graph showing the dependence of the maximum hFE (current amplification factor) of the horizontal bipolar transistor on Ly which was found by the device simulation. In the case of the lower concentration profile ((1) in FIG. 5), as Ly is increased from 1 μm to 6.5 μm, the hFE value of the horizontal bipolar transistor declines. From this it can be easily predicted that improvement in the tolerance of the protection device 10 will be less effective. Although the decline in hFE can be compensated for by decreasing the value of Lt, the value of Lt should not be too small because if Lt should be too small, the trigger voltage control range would be narrow. Therefore, it is better that the width Ly of the second conductivity type layer 150 is smaller and desirably it should be not more than half of the distance Lt between the first conductivity type layer 140 (emitter of the horizontal bipolar transistor) and the base layer 120.

Second Embodiment

Figure 13:
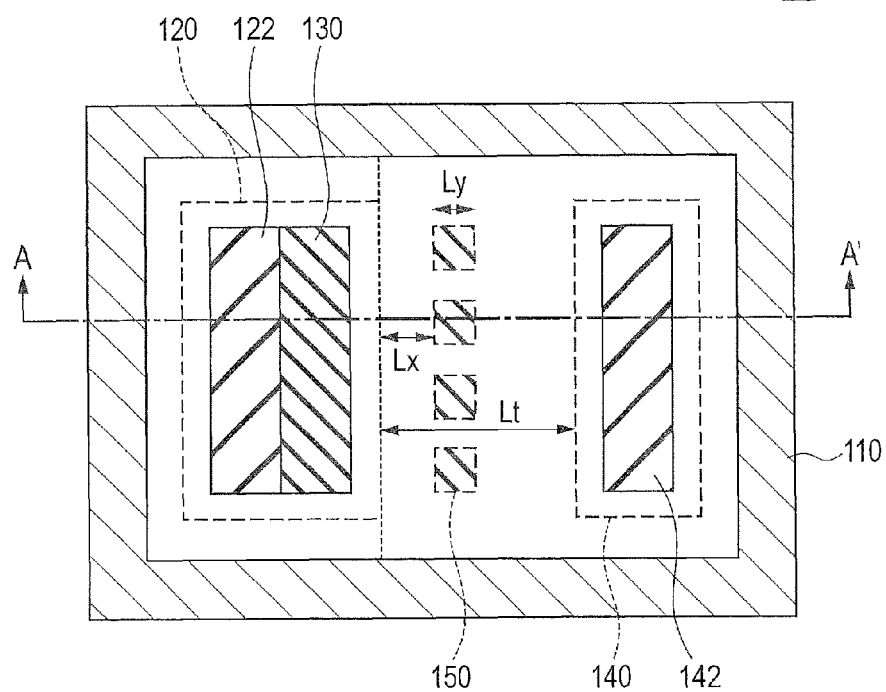
FIG. 13 is a plan view showing the structure of the protection device of a semiconductor device according to a second embodiment of the invention.

FIG. 13 is a plan view showing the structure of the protection device 10 of a semiconductor device according to the second embodiment and is to the second embodiment what FIG. 2 is to the first embodiment. The semiconductor device according to the second embodiment is structurally the same as the semiconductor device according to the first embodiment except that a plurality of second conductivity type layers 150 are spaced from each other like islands along the first direction (vertical direction in FIG. 13).

The second embodiment also brings about the same effect as the first embodiment. In addition, since the second conductivity type layers 150 are arranged like islands, even if the concentrations of the second conductivity type layers 150 are the same as in the first embodiment, the second embodiment can achieve the same effect as the effect which the first embodiment achieves when the concentration of the second conductivity type layer 150 is low. Therefore, even if the required concentration for the extension region 335 is higher than that for the second conductivity type layers 150, the extension region 335 and second conductivity type layers 150 can be formed in a process by adjusting the size of the second conductivity type layers 150 and their spacing.

Third Embodiment

Figure 14:
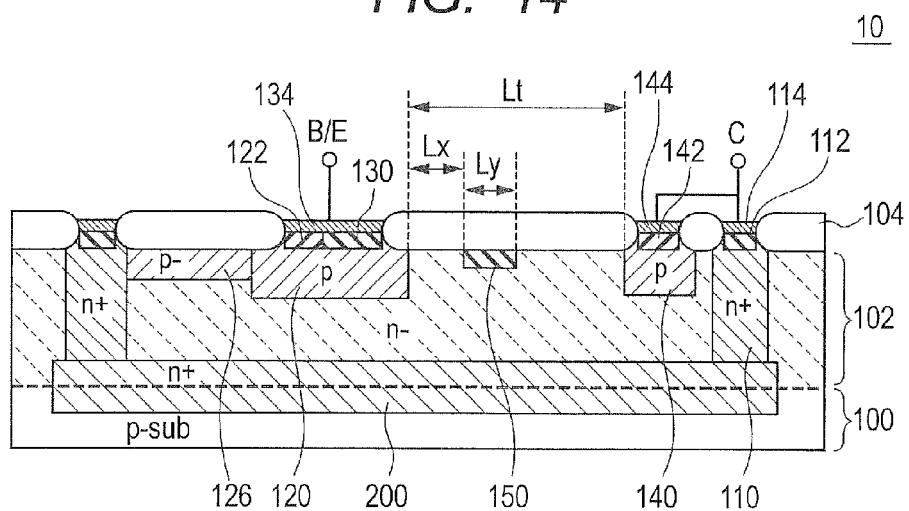
FIG. 14 is a sectional view showing the structure of the protection device of a semiconductor device according to a third embodiment of the invention.

FIG. 14 is a sectional view showing the structure of the protection device 10 of a semiconductor device according to the third embodiment and is to the third embodiment what FIG. 1A is to the first embodiment. The semiconductor device according to the third embodiment is structurally the same as the semiconductor device according to the first or second embodiment except that the protection device 10 includes a lower doped base layer 126.

The lower doped base layer 126 is formed in the lower doped collector layer 102 and in a plan view, it is on the opposite side of the second conductivity type layer 150 with the base layer 120 between them, adjoining the base layer 120. The impurity concentration of the lower doped base layer 126 is lower than that of the base layer 120. In this embodiment, the lower doped base layer 126 also adjoins the sinker layer 110 though it need not adjoin the sinker layer 110.

The third embodiment also brings about the same effect as the first or second embodiment. In addition, the existence of the lower doped base layer 126 reduces the possibility that a breakdown in the interface between the base layer 120 and lower doped collector layer 102 occurs on the side where the second conductivity type layer 150 is not located.

Fourth Embodiment

Figure 15:
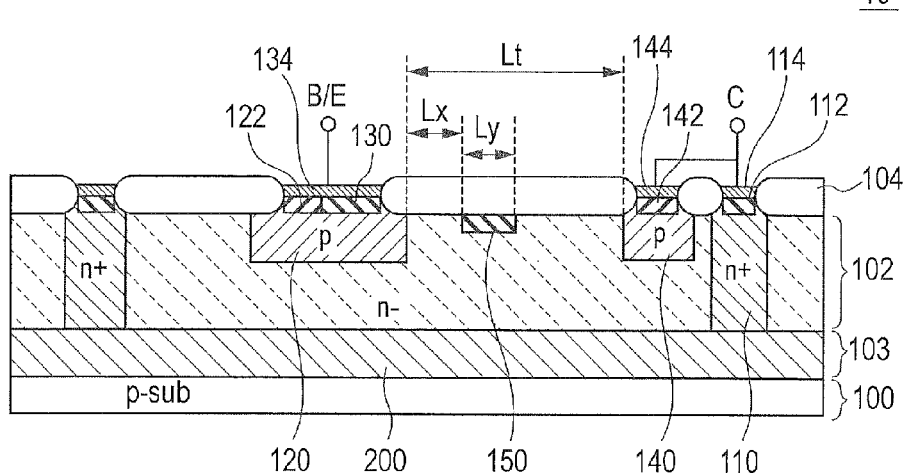
FIG. 15 is a sectional view showing the structure of the protection device of a semiconductor device according to a fourth embodiment of the invention.

FIG. 15 is a sectional view showing the structure of the protection device 10 of a semiconductor device according to the fourth embodiment and is to the fourth embodiment what FIG. 1A is to the first embodiment. The semiconductor device according to the fourth embodiment is structurally the same as the semiconductor device according to any of the first to third embodiments except the following points. FIG. 15 shows the same case as in the first embodiment.

First, the protection device 10 uses an SOI substrate. Specifically, a buried insulating layer 103 is formed over the substrate 100 and a lower doped collector layer 102 is formed over the buried insulating layer 103. No buried layer 200 is formed and the bottom of the sinker layer 110 adjoins the buried insulating layer 103.

The fourth embodiment also brings about the same effect as the first to third embodiments.

The preferred embodiments of the present invention have been described so far referring to the drawings, but they are just illustrative and the invention is not limited thereto. The invention may be embodied in other various ways.

What is claimed is:

1. A semiconductor device, including:
a protection device; and
a protected device, the protection device comprising:
a first semiconductor region of a second conductivity type formed over a substrate;
a second semiconductor region of the second conductivity type provided in the first semiconductor region, having a higher impurity concentration than the first semiconductor region;
a third semiconductor region of the second conductivity type formed in a surface layer of the second semiconductor region, having a higher impurity concentration than the second semiconductor region;
a fourth semiconductor region of the second conductivity type formed in the first semiconductor region and located away from the third semiconductor region, having a higher impurity concentration than the first semiconductor region;
a fifth semiconductor region of a first conductivity type formed in the first semiconductor region and electrically short-circuited with the fourth semiconductor region;
a sixth semiconductor region of the first conductivity type located so as to contain the fourth semiconductor region and the fifth semiconductor region;
a seventh semiconductor region of the first conductivity type formed in the first semiconductor region, located between the second semiconductor region and the sixth semiconductor region away from the sixth semiconductor region, and electrically short-circuited with the third semiconductor region; and
an eighth semiconductor region of the second conductivity type formed in the first semiconductor region and located between the sixth semiconductor region and the seventh semiconductor region away from the seventh semiconductor region, the eighth semiconductor region having a higher impurity concentration than the first semiconductor region.

2. The semiconductor device according to claim 1, wherein the protected device is arranged over the substrate.

3. The semiconductor device according to claim 1, wherein the protected device includes a MOS transistor arranged over the substrate.

4. The semiconductor device according to claim 1, wherein the second semiconductor region surrounds the first semiconductor region.

5. The semiconductor device according to claim 1, wherein the eighth semiconductor region has a lower impurity concentration than the second semiconductor region.

6. The semiconductor device according to claim 1, wherein in a plan view, sides of the fourth semiconductor region and the seventh semiconductor region which stretch in a first direction face each other and the eighth semiconductor region stretches in the first direction.

7. The semiconductor device according to claim 1, wherein in a plan view, sides of the fourth semiconductor region and the seventh semiconductor region which stretch in a first direction face each other and a plurality of the eighth semiconductor region stretch in the first direction in an island arrangement.

8. The semiconductor device according to claim 1, wherein in the eighth semiconductor region, a width in a direction perpendicular to the first direction is not more than half of a distance between the sixth semiconductor region and the seventh semiconductor region.

9. The semiconductor device according to claim 1, further comprising a device isolation film for separating the fourth semiconductor region and the seventh semiconductor region, wherein the eighth semiconductor region is located under the device isolation film.

10. The semiconductor device according to claim 1, wherein the second semiconductor region surrounds the fourth semiconductor region, the fifth semiconductor region, the seventh semiconductor region, and the eighth semiconductor region.

11. The semiconductor device according to claim 1, further comprising:
a tenth semiconductor region formed in the first semiconductor region and coupled to the sixth semiconductor region on an opposite side of the eighth semiconductor region with the sixth semiconductor region between them in a plan view, having a lower impurity concentration than the sixth semiconductor region.

12. The semiconductor device according to claim 1, further comprising:
an eleventh semiconductor region of the second conductivity type located in a boundary between the substrate and the first semiconductor region and formed in a position to overlap the fourth semiconductor region, the third semiconductor region, the sixth semiconductor region, the seventh semiconductor region, and the eighth semiconductor region in a plan view, adjoining the second semiconductor region and having a higher impurity concentration than the first semiconductor region.

13. The semiconductor device according to claim 1, further comprising:
a buried insulating layer formed over the substrate, wherein the first semiconductor region is formed over the buried insulating layer.

14. A semiconductor device, including:
a protected device; and
a protection device each formed over a substrate, the protection device comprising:
a first semiconductor region of a second conductivity type foil led over a substrate;
a second semiconductor region of the second conductivity type provided in the first semiconductor region, having a higher impurity concentration than the first semiconductor region;
a third semiconductor region of the second conductivity type formed in a surface layer of the second semiconductor region, having a higher impurity concentration than the second semiconductor region;
a fourth semiconductor region of the second conductivity type formed in the first semiconductor region and located away from the third semiconductor region, having a higher impurity concentration than the first semiconductor region;
a fifth semiconductor region of a first conductivity type formed in the first semiconductor region and electrically short-circuited with the fourth semiconductor region;

a sixth semiconductor region of the first conductivity type located so as to contain the fourth semiconductor region and the fifth semiconductor region; and a seventh semiconductor region of the first conductivity type formed in the first semiconductor region, located between the second semiconductor region and the sixth semiconductor region away from the sixth semiconductor region, and electrically short-circuited with the third semiconductor region.

15. The semiconductor device according to claim 14, wherein the protected device includes a MOS transistor arranged over the substrate.

16. The semiconductor device according to claim 14, wherein the second semiconductor region surrounds the first semiconductor region.

17. The semiconductor device according to claim 14, further comprising:
an eighth semiconductor region of the second conductivity type formed in the first semiconductor region.

18. The semiconductor device according to claim 17, wherein the eighth semiconductor region is located between the sixth semiconductor region and the seventh semiconductor region.

19. The semiconductor device according to claim 18, wherein the eighth semiconductor region has a higher impurity concentration than the first semiconductor region.

20. The semiconductor device according to claim 17, wherein the eighth semiconductor region is located between the sixth semiconductor region and the seventh semiconductor region away from the seventh semiconductor region.

* * * * *